(12) United States Patent
Nakaguro

(10) Patent No.: US 6,744,735 B1
(45) Date of Patent: Jun. 1, 2004

(54) DIAGNOSTIC DEVICE, DIAGNOSTIC METHOD, AND NETWORK SYSTEM HAVING DIAGNOSTIC FACILITY

(75) Inventor: Kunio Nakaguro, Kanagawa (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 09/565,077

(22) Filed: May 4, 2000

(30) Foreign Application Priority Data

May 12, 1999 (JP) .......................................... 11-131581

(51) Int. Cl.[7] .................................................. H04J 3/14
(52) U.S. Cl. ...................... 370/242; 370/248; 340/438; 340/853.2; 701/29
(58) Field of Search .............................. 370/241, 241.1, 370/242, 244, 246, 247, 248, 249; 340/438, 853.2; 701/29, 30, 97

(56) References Cited

U.S. PATENT DOCUMENTS 5,977,913 A * 11/1999 Christ ........................ 342/465
6,006,146 A * 12/1999 Usui et al. ..................... 701/29
6,025,776 A * 2/2000 Matsuura .................... 340/438

* cited by examiner

Primary Examiner—Seema S. Rao
Assistant Examiner—Inder Pal Mehra
(74) Attorney, Agent, or Firm—McDermott, Will & Emery (57) ABSTRACT

In a network system having a network diagnostic facility, a plurality of control units are provided, each one of the control units being connected to a common communication line via its corresponding branch line to enable a mutual communication with the other control unit; and a normal state checking facility responsive to a diagnostic command signal from a network diagnostic device to transmit an interrogation signal from any one of the control units to all of the other control units which are connected to the common communication line and to output respective results of receiving acknowledgement signals from the all of the other control units within respective constant periods of time in response to the interrogation signal transmitted from the one of the control units to the diagnostic device, the health state checking facility being installed on each of the control units. The network diagnostic device generates a correlation map for an engineer to intuitively recognize a location of the failure in the network system.

10 Claims, 6 Drawing Sheets

|   | A | B | C | D | E | F |
|---|---|---|---|---|---|---|
| A | x1y1 | x2y1 | x3y1 | x4y1 | x5y1 | x6y1 |
| B | x1y2 | x2y2 | x3y2 | x4y2 | x5y2 | x6y2 |
| C | x1y3 | x2y3 | x3y3 | x4y3 | x5y3 | x6y3 |
| D | x1y4 | x2y4 | x3y4 | x4y4 | x5y4 | x6y4 |
| E | x1y5 | x2y5 | x3y5 | x4y5 | x5y5 | x6y5 |
| F | x1y6 | x2y6 | x3y6 | x4y6 | x5y6 | x6y6 |

|   | A | B | C | D | E | F |
|---|---|---|---|---|---|---|
| A | x1y1 | x2y1 | x3y1 | x4y1 | x5y1 | x6y1 |
| B | x1y2 | x2y2 | x3y2 | x4y2 | x5y2 | x6y2 |
| C | x1y3 | x2y3 | x3y3 | x4y3 | x5y3 | x6y3 |
| D | x1y4 | x2y4 | x3y4 | x4y4 | x5y4 | x6y4 |
| E | x1y5 | x2y5 | x3y5 | x4y5 | x5y5 | x6y5 |
| F | x1y6 | x2y6 | x3y6 | x4y6 | x5y6 | x6y6 |

DIAGNOSTIC DEVICE, DIAGNOSTIC METHOD, AND NETWORK SYSTEM HAVING DIAGNOSTIC FACILITY

BACKGROUND OF THE INVENTION a) Field of the Invention

The present invention relates to a network diagnostic device, a network diagnostic method, and a network system having diagnostic facility for the network.

b) Description of the Related Art

In a previously proposed diagnostic method for a network having a plurality of control units, each control unit being connected to a common communication line via a corresponding branch line, a communication malfunction indicative lamp installed for each control unit is illuminated to inform a user of an occurrence of the communication malfunction and, then, the user replaces the corresponding control unit on which the communication malfunction indicative lamp is illuminated with a new one so that the network is recovered to its original, normal communication state in a case where each control unit detects the occurrence of the malfunction of communications in itself, viz., within an internal of its control unit by means of its self-diagnostic function.

SUMMARY OF THE INVENTION

In the previously proposed diagnostic method for the network, in a case where the control unit itself has failed, the network system is recovered to its normal communication state with the failed control unit replaced with the new one.

However, in a case where a failure (or, so-called, a trouble) due to a broken line or due to a ground fault occurs in a certain point of place in the common communication line, the self-diagnostic function (facility) that each control unit has cannot identify the failed point of place (cannot locate the trouble) and the user must remove sequentially the related control units on each of which the communication failure indicative lamp is illuminated to identify the failed point of place, thereby lots of cost and time being required.

It is therefore an object of the present invention to provide a network diagnostic device, a network diagnostic method, and a network system having a diagnostic facility which can easily locate the trouble in communication even in the common communication line of the network in addition to the trouble in each branch line connected to its corresponding one of the plurality of control units when a communication malfunction in the network occurs.

The above-described object can be achieved by providing a network diagnostic device, comprising: a diagnostic communication line connected to all of a plurality of control units, each of the control units being connected to a common communication line via its corresponding branch line to enable a mutual communication with the other control unit; a normal state determining section that operatively performs such a network diagnostic processing as to cause each one of the control units to transmit an interrogation signal to all of the other control units and as to determine whether an acknowledgement signal is transmitted from each of the all of the other control units to the each one of the control units in response to the interrogation signal within a predetermined period of time to determine a normal state of a communication between each one of the control units and the other thereof; and a map display section that displays a correlation map in a matrix form having a plurality of matrix intersections, each matrix intersection being a one-to-one combination of any one of the control units and the other of the control units and being displayed in a pattern such as to be discriminated between the normal state of the communication and an abnormal state thereof.

The above-described object can also be achieved by providing a network diagnostic method, comprising: connecting a diagnostic communication line to all of a plurality of control units, each of the control units being connected to a common communication line via its corresponding branch line to enable a mutual communication with the other control unit; performing such a network diagnostic processing as to cause each one of the control units to transmit an interrogation signal to all of the other control units and as to determine whether an acknowledgement signal is transmitted from each of the all of the other control units to the each one of the control units in response to the interrogation signal within a predetermined period of time to determine a normal state of a communication between each one of the control units and the other thereof; and displaying a correlation map in a matrix form having a plurality of matrix intersections, each matrix intersection being a one-to-one combination of any one of the control units and the other of the control units and being displayed in a pattern such as to be discriminated between the normal state of the communication and an abnormal state thereof.

The above-described object can also be achieved by providing a network system having a network diagnostic facility, comprising: a plurality of control units, each one of the control units being connected to a common communication line via its corresponding branch line to enable a mutual communication with the other control unit; a normal state checking facility responsive to a diagnostic command signal from an external to the network system to transmit an interrogation signal from any one of the control units to all of the other control units which are connected to the common communication line and to output respective results of receiving acknowledgement signals from the all of the other control units within respective constant periods of time in response to the interrogation signal transmitted from the one of the control units to the external to the network system, the health state checking facility being installed on each of the control units.

DETAILED DESCRIPTION OF THE PREFERRED EMBODIMENTS

Reference will hereinafter be made to the drawings in order to facilitate a better understanding of the present invention.

Figure 1:
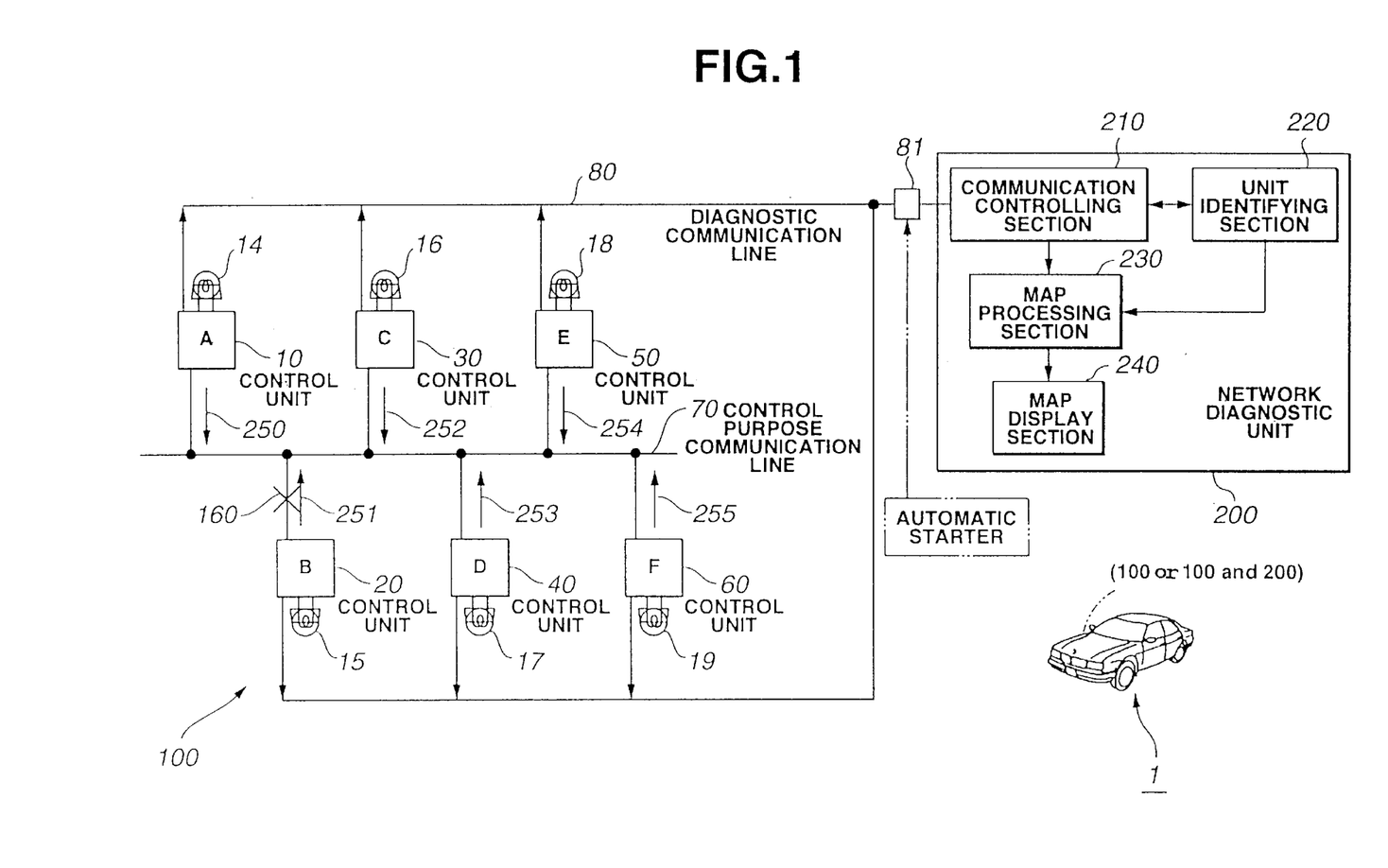
FIG. 1 is a whole system configuration block diagram of a network system applicable to an automotive vehicle in a preferred embodiment according to the present invention to which a network diagnostic device in a preferred embodiment according to the present invention is connected.

FIG. 1 shows a whole system configuration of a network diagnosing system constituted by a network diagnosing device (unit) 200 in a preferred embodiment connected to a network system 100 mounted in an automotive vehicle 1 in a form of an inner vehicle LAN (Local Area Network).

The network system 100 includes a plurality of control units A10, B20, C30, D40, E50, and F60 connected respectively to a common control purpose communication line 70. Each control unit is constituted by a microcomputer system as exemplified by a U.S. Pat. No. 6,025,776 issued on Feb. 15, 2000, the disclosure of which is herein incorporated by reference.

Each control unit A10 through F60 has a generally available self-diagnosis function to diagnose itself. Such a self-diagnosis function as described above is exemplified by the U.S. Pat. No. 6,025,776 issued on Feb. 15, 2000.

In addition, a plurality, of communication malfunction indicators (lamps) 14 through 19 to inform an engineer (or user) of a detection of a malfunction in the corresponding control unit and in the connected communication line.

Furthermore, a diagnostic communication line 80 is connected in a daisy chain form (i.e., serially) to the respective control units A10 through F60 apart from the control purpose communication line 70. The network diagnostic device may be connected to each control unit A10 through F60 in a parallel form. A connection terminal 81 for an external connection is installed in the diagnostic communication line 80.

The network diagnostic device 200 is used with its input end connected to the connection terminal 81 of the diagnostic communication line 80 for the network system 100 by the engineer.

The network diagnostic device 200 includes a communication control section 210 to control communications to the network system 100, a control unit identifying section 200 which determines the control unit in the failed communication line, a map processing section 230 which generates a correlation map representing each correlation between the control units A10 through F60; and a map display section 240 which displays the correlation map generated by the map processing section 230.

Next, an operation of the network system shown in FIG. 1 will be described below.

If any one of the control units A10 through F60 cannot communicate with any other one or more of the control units, the corresponding control unit makes the self-diagnosis determining the occurrence of the malfunction and illuminates one of the malfunction occurrence indicative lamps 14 through 19 with which the corresponding control unit is equipped to inform the engineer of the occurrence of malfunction.

If the engineer confirms that any one or more of the malfunction occurrence indicative lamps 14 through 19 is illuminated, the network diagnostic device 200 is connected to the network system 100 to be diagnosed to identify in which line the malfunction occurrence takes place in the network system shown in FIG. 1.

This identifying procedure is as follows:

The unit identifying section 220 of the network diagnostic device 200 issues and sends a self-diagnostic operation command to one of the control units A10 belonging to the network system for a system diagnosis via the communication controlling section 210, the connection terminal 81, and the diagnostic communication line 80.

The control unit A10 upon receipt of the diagnosis signal command, is operated to transmit the diagnostic signals sequentially or randomly to any other control units B20 through F60 connected to the control purpose communication line 70 and is operated to receive a response signal from each of the other control units B20 through F60. The response signal received within a constant period of time is transmitted to the network diagnostic device 200 with a unit number of the response signal transmitted control unit attached to the response signal via the diagnostic communication line 80.

The unit identifying section 220 located at the network diagnostic device 200 receives the signal indicating a result of diagnosis from the control unit A10 and passes it to the map processing section 230.

Figure 3:
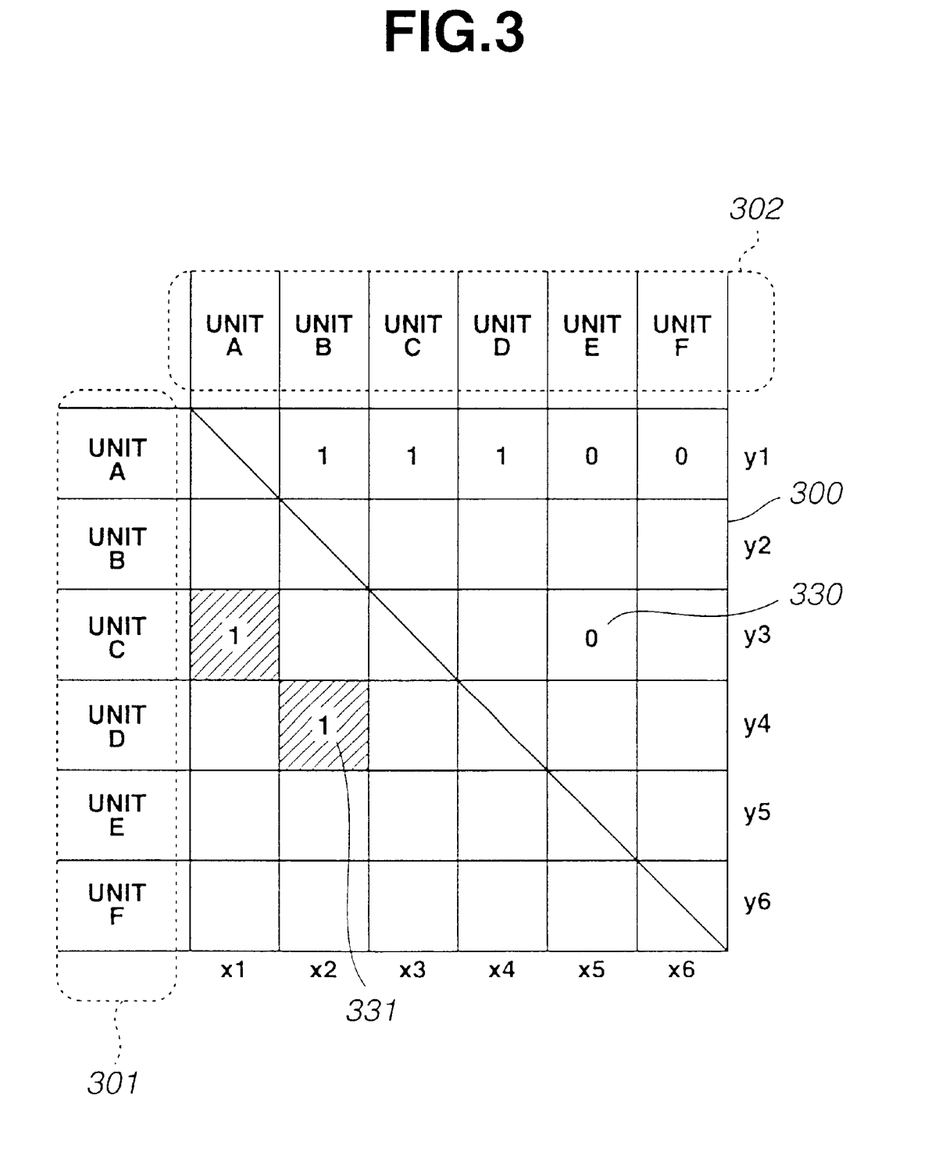
FIG. 3 is an explanatory view of a correlation map generated by the network diagnostic device shown in FIG. 1.

The map processing section 230 generates a correlation map shown in FIG. 3. A longitudinal direction 301 (row) in FIG. 3 indicates the control units (Units A, B, C, D, E, and F) 301 from each of which the diagnostic signal is transmitted and a lateral direction (column) in FIG. 3 indicates the control units (Units A, B, C, D, E, and F) 302 from each of which the response signal is transmitted within the constant period of time from the control units E50 and F60.

Figure 2:
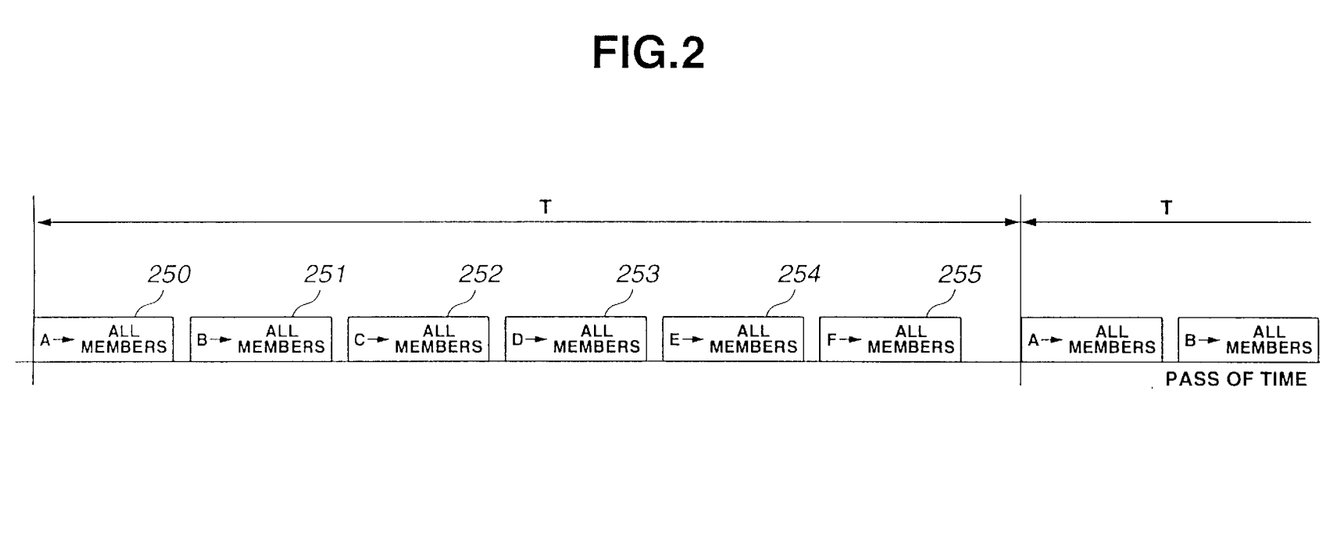
FIG. 2 is a timing chart on a network diagnosing operation in the network system shown in FIG. 1.

Hereinafter, the unit identifying section 220 at the network diagnostic device 200 transmits the diagnostic operation commands sequentially an alphabetical order from A to F to the control units B20 through F60 as shown at the steps 251 through 265 in FIG. 2 to make the same diagnostic operations for the respective control units B20 through F60.

The map processing section 230 registers a binary data either of 1 (331 in FIG. 3) when the corresponding control unit A10 through F60 receives the response signal from the other specified control units or of 0 (330 in FIG. 3) when the corresponding control unit A10 through F60 does not receive the response signal for each matrix intersection. This whole processing operation is repeated for each time T.

Figure 4A:
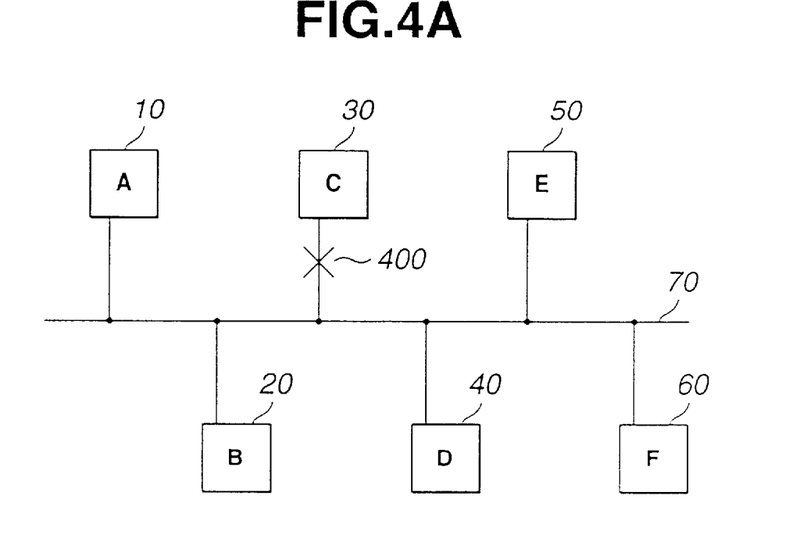
FIG. 4A is an explanatory view of a failure case of a wire broken in one of branch lines connected to one of a plurality of control units (control unit C) shown in FIG. 1.

Suppose now that a broken wire or any other failure occurs on a branch line 400 from the control purpose communication line 70 with respect to the control unit C30, as shown in FIG. 4A. In this case, the interrogation signal transmitted from the control unit C30 does not arrive at any other control units. In addition, the response signal from the control unit C30 is not returned back in response to the interrogation signal transmitted from any other control units.

Hence, in this case, the correlation map 300 indicates that the lateral row in one of the control units, viz., C30 and that all of network coordinates (x1, y3) through (x6, y3) represents that the communications are un-established and "0"s are registered into these matrix intersections. In addition, on the respective lateral rows of the other control units A10, B20, D40, E50, and F60, "0"s are registered into the matrix intersections to the control unit C30 which indicates the un-establishment of the communications.

Figure 4B:
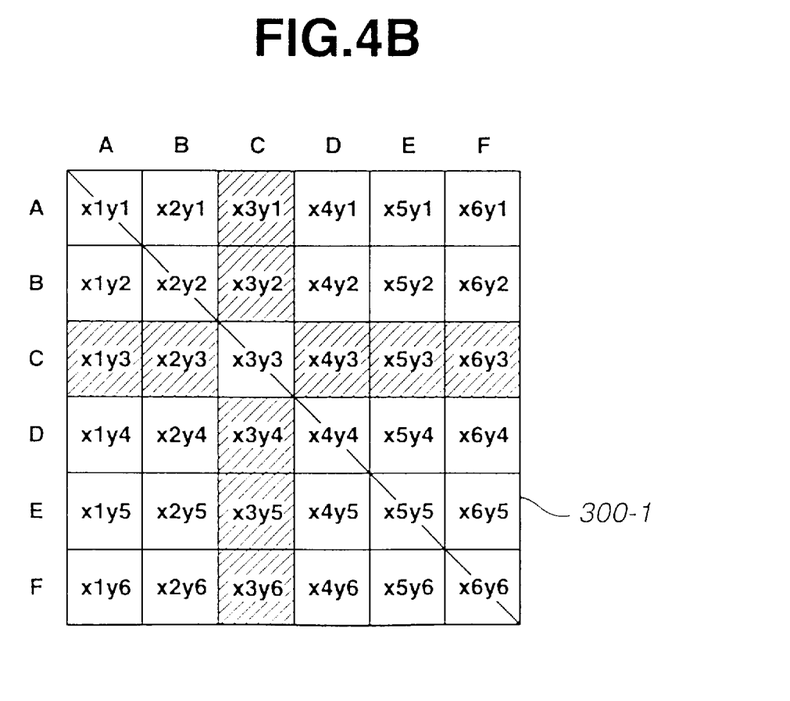
FIG. 4B is an explanatory view of a correlation map for explaining a pattern of 0s on the correlation map when the failure case shown in FIG. 4A occurs.

Therefore, the correlation map 300 generated in the map processing section 230 and displayed on the map display section 240 is displayed in the form of the display pattern of a map 300-1 shown in FIG. 4B.

The engineer can intuitively recognize that the failure (malfunction) has occurred on the branch line 400 from the control unit C30 from the control purpose communication line 70.

Figure 5A:
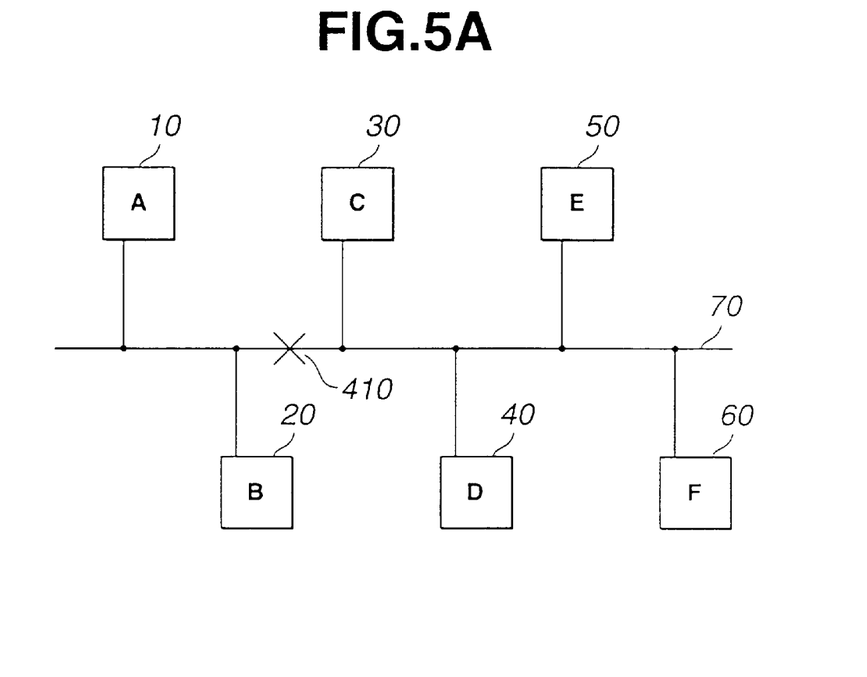
FIG. 5A is an explanatory view of another failure case of the wire broken in a midway through the common communication line of the network shown in FIG. 1.

In addition, as shown in FIG. 5A, if the wire breakage or other failure occurs at an intermediate point 410 on the control purpose communication line 70, the communication between the control unit A10 and the control unit B20 is possible and mutual communications between the control units C30 through F60 are also possible. However, the communication between both groups is possible.

Figure 5B:
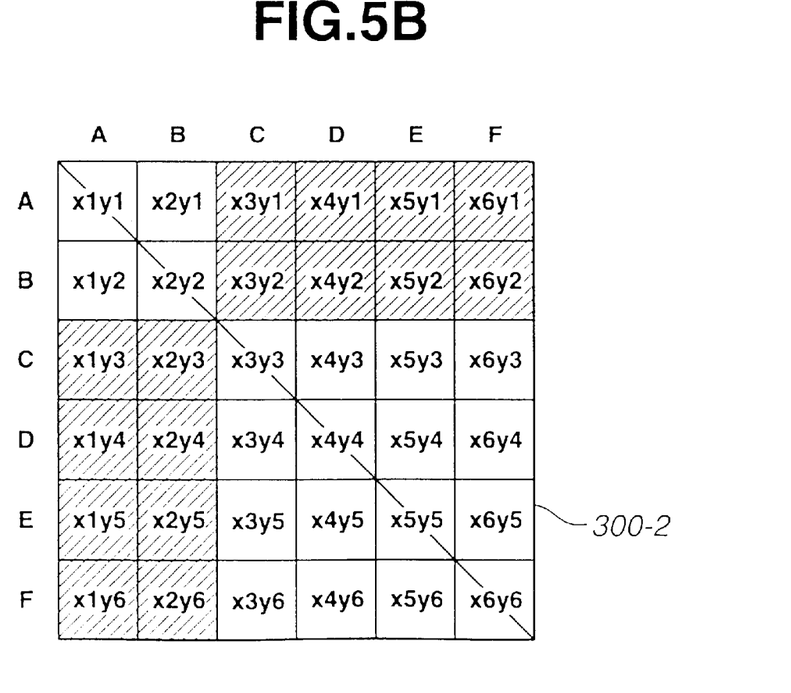
FIG. 5B is an explanatory view of the correlation map for explaining another pattern of 0s on the correlation map when the failure case in FIG. 5A occurs.

Hence, in the case of the correlation map 300 the correlation map indicating the establishment/un-establishment of communication as in the pattern 300-2 shown in FIG. 5B is generated and displayed on the map display section 240. The engineer can intuitively recognize that any malfunction between the control unit B20 and the control unit C30 has occurred from the pattern of 300-3.

Figure 6A:
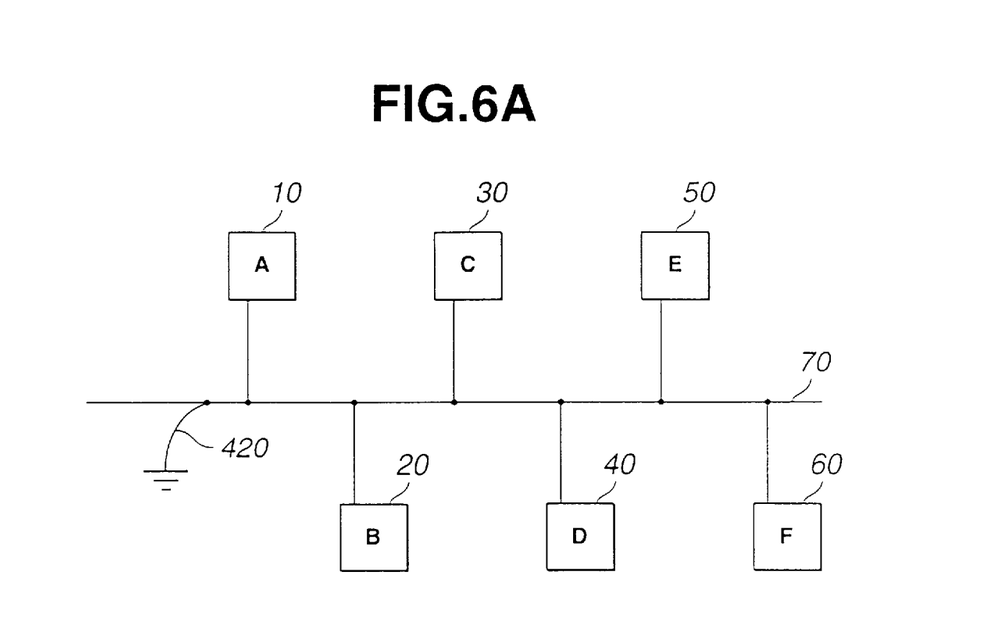
FIG. 6A is an explanatory view of another failure case of a ground fault in the common communication line of the network shown in FIG. 1.

Furthermore, when the ground failure occurs on the control purpose communication line 70 as shown in FIG. 6A, the communication becomes possible between all control units A10 through F60.

Figure 6B:
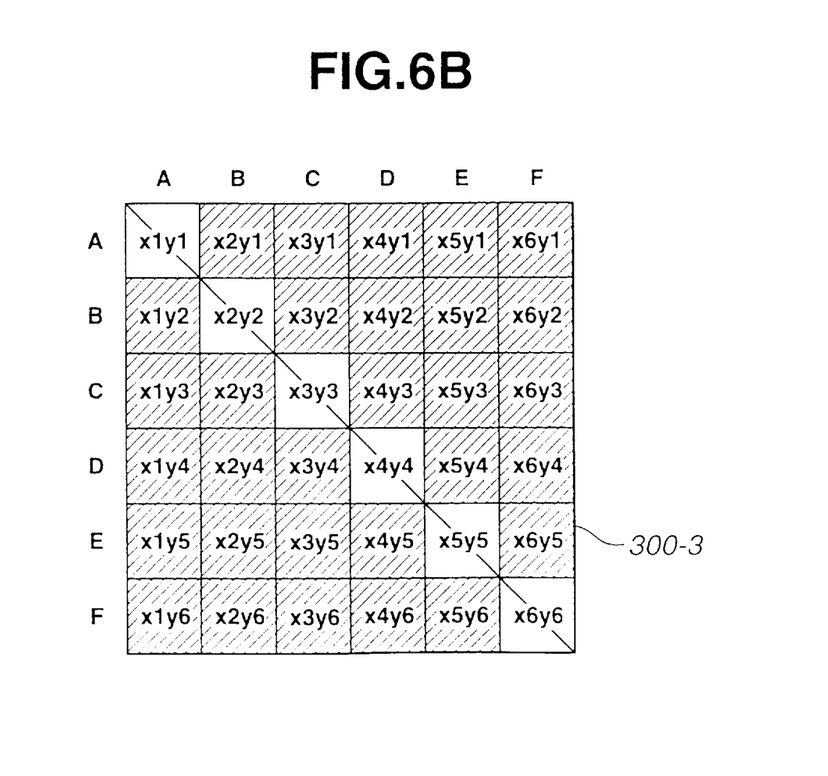
FIG. 6B is an explanatory view of the correlation map for explaining still another pattern of 0s on the correlation map when the failure case in FIG. 6A occurs.

Hence, the correlation map 300, in this case, as shown in the correlation map pattern 303-3 of FIG. 6B is generated and displayed. The engineer can intuitively recognize that the ground fault occurs on the control purpose communication line 70 from the map pattern of 303-3 in FIG. 6B.

According to the network diagnostic device in the first embodiment, the network diagnostic device is connected to the network system and has the correlation map displayed on the map display section. On the basis of a discriminating pattern of the communication establishment and un-establishment, a first glance can provide an easy recognition in which one or more of the control units, in which one of the branch lines the failure occurs or which line including the common communication line the ground fault occurs.

It is noted that six control units and related control purpose communication lines are objects to be diagnosed in the embodiment of the diagnostic device 200. However, any number of the control units may be the one of the objects to be diagnosed. In addition, a form of the pattern display on the correlation map may be arbitrary. For example, a color change or shading for the 0 registered parts and for 1, registered parts of the matrix intersections may be used for the correlation map.

It is also noted that in a case where the failure display is carried out through any one or more of the control units at the side of the network system 100 which is mounted, the user brings the vehicle at a repair factory. At the repair factory, the network diagnostic device 200 is connected to the connection terminal 81 of the diagnostic communication line 80 and the network diagnosis is carried out. However, such a form as described below may be carried out.

That is to say, with the network system 100 and the diagnostic device 200 at first interconnected and mounted in the vehicle 1, the network diagnostic device 200 may automatically start (using a starter denoted in a phantom line of FIG. 1) the network diagnostic processing and may display the result of the diagnosis in the form of the correlation map when the failure detection signal from any control unit via the diagnosis in the form of the correlation map when the failure detection signal is transmitted from any control unit via the diagnostic communication line.

It is noted that although, in the embodiment shown in FIG. 1, a network topology is a bus type, the network topology may be a star type, ring type, or any other type without a detouring route.

It is also noted that the response signal described above includes acknowledgement (ACK) signal or may include an non-acknowledgement (NACK) signal.

The entire contents of a Japanese Patent Application No. Heisei 11-131581 (filed in Japan on May 12, 1999) are herein incorporated by reference. Although the invention has been described above by reference to certain embodiments of the invention, the invention is not limited to the embodiments described above. Modifications and variations of the embodiments described above will occur to those skilled in the art in the light of the above teachings. The scope of the invention is defined with reference to the following claims.

What is claimed is:

1. A network diagnostic device, comprising:
a diagnostic communication line connected to all of a plurality of control units, each of the control units being connected to a common communication line via its corresponding branch line to enable a mutual communication with the other control unit;
a normal state determining section that operatively performs such a network diagnostic processing as to cause each one of the control units to transmit an interrogation signal to all of the other control units and as to determine whether an acknowledgement signal is transmitted from each of the all of the other control units to the each one of the control units in response to the interrogation signal within a predetermined period of time to determine a normal state of a communication between each one of the control units and the other thereof; and
a map display section that displays a correlation map in a matrix form having a plurality of matrix intersections, each matrix intersection being a one-to-one combination of any one of the control units and the other of the control units and being displayed in a pattern to discriminate between the normal state of the communication and an abnormal state thereof.

2. A network diagnostic device as claimed in claim 1, wherein each of the control units is provided with an abnormal state indicator to indicate that it is impossible to communicate its corresponding control unit with any other of the control units in response to a communication malfunction signal outputted from its corresponding control unit and further comprising an automatic starter to start automatically the network diagnostic processing of the normal state determining section.

3. A network diagnostic device as claimed in claim 1, wherein a number of the matrix intersections on the correlation map is as follows: (a number of the control units in the network)$^2$—a number of the same control units in column and row of the matrix formed correlation map.

4. A network diagnostic device as claimed in claim 3, wherein the diagnostic communication line is connected to all of the control units in a daisy chain configuration, a network topology is a bus type, and the health state determining section issues a diagnostic command signal to each of the control units sequentially via the diagnostic command communication line to transmit the interrogation signal to all of the other control units and determines whether the acknowledgement signal is transmitted from each of all of the other control units to the interrogation signal transmitted control units within a constant period of time, the issuing the diagnostic command signal and the determining whether the acknowledgement signal is transmitted from each of all of the other control units to the interrogation signal transmitted control unit within the constant period of time being repeated for all of the control units until a constant period of time T has passed.

5. A network diagnostic device as claimed in claim 4, wherein the health state determining section includes a map processing section that registers 1 into a corresponding one of the matrix intersections of the correlation map when determining that one of the other control units which corresponds to the matrix intersections has issued the acknowledgement signal with the constant period of time in response to the interruption signal issued from the one of the control units which corresponds to the corresponding one of the matrix intersections and registers 0 into another corresponding one of the matrix intersections when determining that the acknowledgement signal is not received from the one of the other control units within the constant period of time in response to the interrogation signal within the constant period of time.

6. A network diagnostic device as claimed in claim 5, wherein each of the matrix intersections into which 1 is registered is drawn in a different color from each of those into which 0 is registered.

7. A network diagnostic device as claimed in claim 5, wherein 0 is registered to each of all of the matrix intersections when the normal state determining section determines that the abnormal state of the communication which corresponds to a ground fault in the common communication line has occurred, 0 is registered to the corresponding matrix intersections related to one of the control units whose branch line has broken, and 0 is registered to each of the corresponding matrix intersections related to the corresponding control units which has issued the interrogation signal and from which the acknowledgement signal is not received within the constant period of time when the normal state determining section determines the abnormal state of the communication which corresponds to an occurrence of a wire breakage in the common communication line.

8. A network diagnostic device as claimed in claim 2, wherein the network diagnostic device is installed in a vehicle together with the control units and the communication malfunction indicator is a communication malfunction indicating lamp installed on each corresponding control unit.

9. A network diagnostic method, comprising:

connecting a diagnostic communication line to all of a plurality of control units, each of the control units being connected to a common communication line via its corresponding branch line to enable a mutual communication with the other control unit;

performing such a network diagnostic processing as to cause each one of the control units to transmit an interrogation signal to all of the other control units and as to determine whether an acknowledgement signal is transmitted from each of the all of the other control units to the each one of the control units in response to the interrogation signal within a predetermined period of time to determine a normal state of a communication between each one of the control units and the other thereof; and displaying a correlation map in a matrix form having a plurality of matrix intersections, each matrix intersection being a one-to-one combination of any one of the control units and the other of the control units and being displayed in a pattern to discriminate between the normal state of the communication and an abnormal state thereof.

10. A network system having a network diagnostic facility, comprising:

a plurality of control units, each one of the control units being connected to a common communication line via its corresponding branch line to enable a mutual communication with the other control unit;

a normal state checking facility responsive to a diagnostic command signal from an external to the network system to transmit an interrogation signal from any one of the control units to all of the other control units which are connected to the common communication line and to output respective results of receiving acknowledgement signals from the all of the other control units within respective constant periods of time in response to the interrogation signal transmitted from the one of the control units to the external to the network system, the normal state checking facility being installed on each of the control units.

* * * * *